United States Patent
Hu et al.

(10) Patent No.: US 10,090,254 B2
(45) Date of Patent: Oct. 2, 2018

(54) WAFER ALIGNMENT METHODS IN DIE SAWING PROCESS

(71) Applicant: Taiwan Semiconductor Manufacturing Company, Ltd., Hsin-Chu (TW)

(72) Inventors: Yu-Hsiang Hu, Hsin-Chu (TW); Ming-Da Cheng, Jhubei (TW); Chung-Shi Liu, Hsin-Chu (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 39 days.

(21) Appl. No.: 15/131,808

(22) Filed: Apr. 18, 2016

(65) Prior Publication Data
US 2016/0233172 A1 Aug. 11, 2016

Related U.S. Application Data

(63) Continuation of application No. 13/944,225, filed on Jul. 17, 2013, now Pat. No. 9,318,386.

(51) Int. Cl.
*H01L 23/544* (2006.01)
*H01L 21/78* (2006.01)
*H01L 21/683* (2006.01)

(52) U.S. Cl.
CPC ........ *H01L 23/544* (2013.01); *H01L 21/6835* (2013.01); *H01L 21/6836* (2013.01); *H01L 21/78* (2013.01); *H01L 2221/6834* (2013.01); *H01L 2221/68327* (2013.01); *H01L 2223/5442* (2013.01); *H01L 2223/5446* (2013.01); *H01L 2223/54426* (2013.01); *H01L 2924/0002* (2013.01)

(58) Field of Classification Search
CPC ............... H01L 23/544; H01L 21/6835; H01L 21/6836; H01L 21/78
See application file for complete search history.

(56) References Cited

U.S. PATENT DOCUMENTS

| 6,107,164 | A | * | 8/2000 | Ohuchi | H01L 21/78 257/E21.599 |
| 6,607,970 | B1 | * | 8/2003 | Wakabayashi | H01L 21/56 257/618 |
| 8,652,941 | B2 | * | 2/2014 | Indyk | H01L 24/27 438/113 |
| 2008/0265445 | A1 | * | 10/2008 | Feger | H01L 21/563 257/797 |

(Continued)

*Primary Examiner* — John P Dulka
(74) *Attorney, Agent, or Firm* — Slater Matsil, LLP

(57) ABSTRACT

A method includes forming a molding compound molding a lower portion of an electrical connector of a wafer therein. The molding compound is at a front surface of the wafer. The molding compound covers a center region of the wafer, and leaves an edge ring of the wafer not covered. An opening is formed to extend from the front surface of the wafer into the wafer, wherein the opening is in the edge ring of the wafer. A backside grinding is performed on the wafer until the opening is revealed through a back surface of the wafer. The method further includes determining a position of a scribe line of the wafer using the opening as an alignment mark, and sawing the wafer from a backside of the wafer by sawing through the scribe line.

20 Claims, 5 Drawing Sheets

(56) References Cited

U.S. PATENT DOCUMENTS

| | | | |
|---|---|---|---|
| 2009/0102070 A1* | 4/2009 | Feger | H01L 21/563 257/797 |
| 2013/0149841 A1* | 6/2013 | Indyk | H01L 24/29 438/462 |
| 2014/0242756 A1* | 8/2014 | Xue | H01L 21/78 438/113 |

* cited by examiner

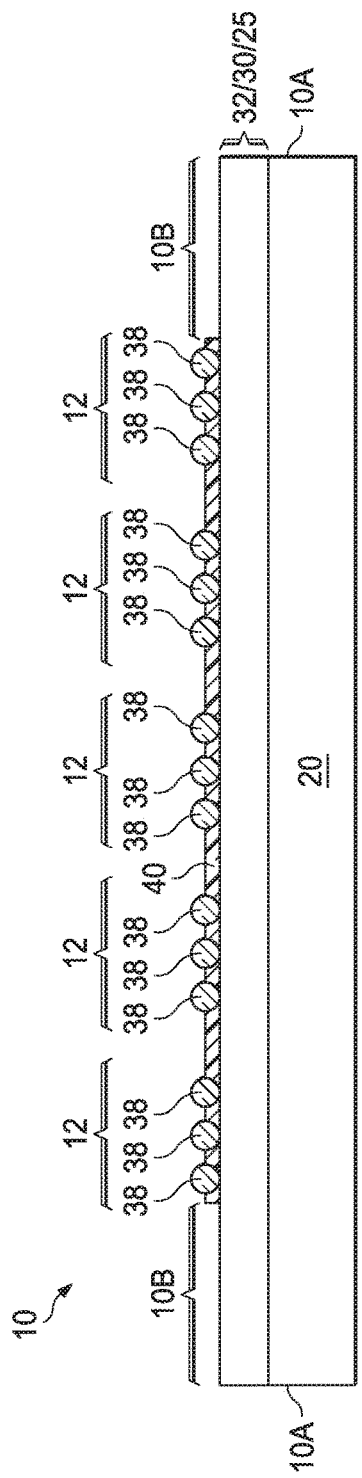
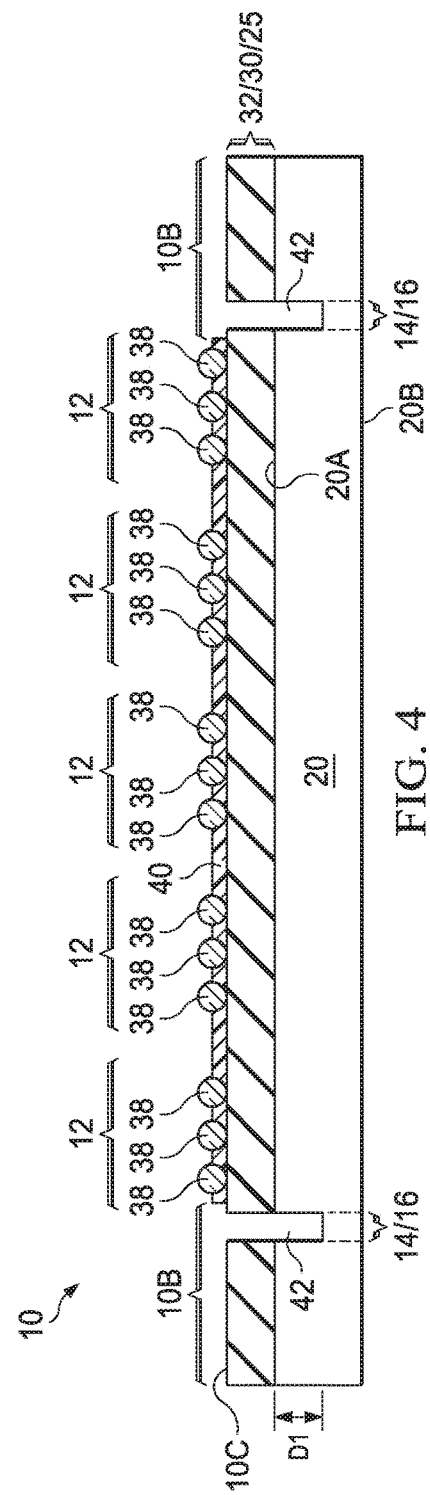

WAFER ALIGNMENT METHODS IN DIE SAWING PROCESS

PRIORITY CLAIM AND CROSS-REFERENCE

This application is a continuation of U.S. patent application Ser. No. 13/944,225, entitled "Wafer Alignment Methods in Die Sawing Process," filed on Jul. 17, 2013, which application is incorporated herein by reference.

BACKGROUND

In the formation of integrated circuits, devices such as transistors are first formed at the surface of a semiconductor substrate, which is a part of a wafer. Interconnect structures are then formed over the semiconductor substrate and the devices. Electrical connectors such as metal bumps and solder balls are formed on the surface of the semiconductor wafer, so that the devices can be accessed. The wafer is then sawed into a plurality of semiconductor dies.

Wafers include scribe lines, which are formed between the semiconductor dies. Scribe lines may be free from circuits, or only include the circuits that can be sawed without affecting the function of the semiconductor dies. For example, monitoring pads may be formed in the scribe lines. To saw the wafer accurately through the scribe lines without damaging the semiconductor dies, the positions of the scribe lines need to be located accurately, and hence the blade used for sawing the wafers may be able to be accurately aligned to the scribe lines.

BRIEF DESCRIPTION OF THE DRAWINGS

For a more complete understanding of the embodiments, and the advantages thereof, reference is now made to the following descriptions taken in conjunction with the accompanying drawings, in which:

FIGS. 3 through 7 are cross-sectional views of intermediate stages in the formation of alignment marks from the front surface of a wafer, and sawing the wafer from its back surface in accordance with some exemplary embodiments.

DETAILED DESCRIPTION OF ILLUSTRATIVE EMBODIMENTS

The making and using of the embodiments of the disclosure are discussed in detail below. It should be appreciated, however, that the embodiments provide many applicable concepts that can be embodied in a wide variety of specific contexts. The specific embodiments discussed are illustrative, and do not limit the scope of the disclosure.

A method for forming alignment marks and the methods of using the alignment marks for backside die-sawing are provided in accordance with various exemplary embodiments. The intermediate stages of forming the alignment marks and using the alignment marks for performing backside sawing are illustrated. The variations of the embodiments are discussed. Throughout the various views and illustrative embodiments, like reference numbers are used to designate like elements.

Figure 1:
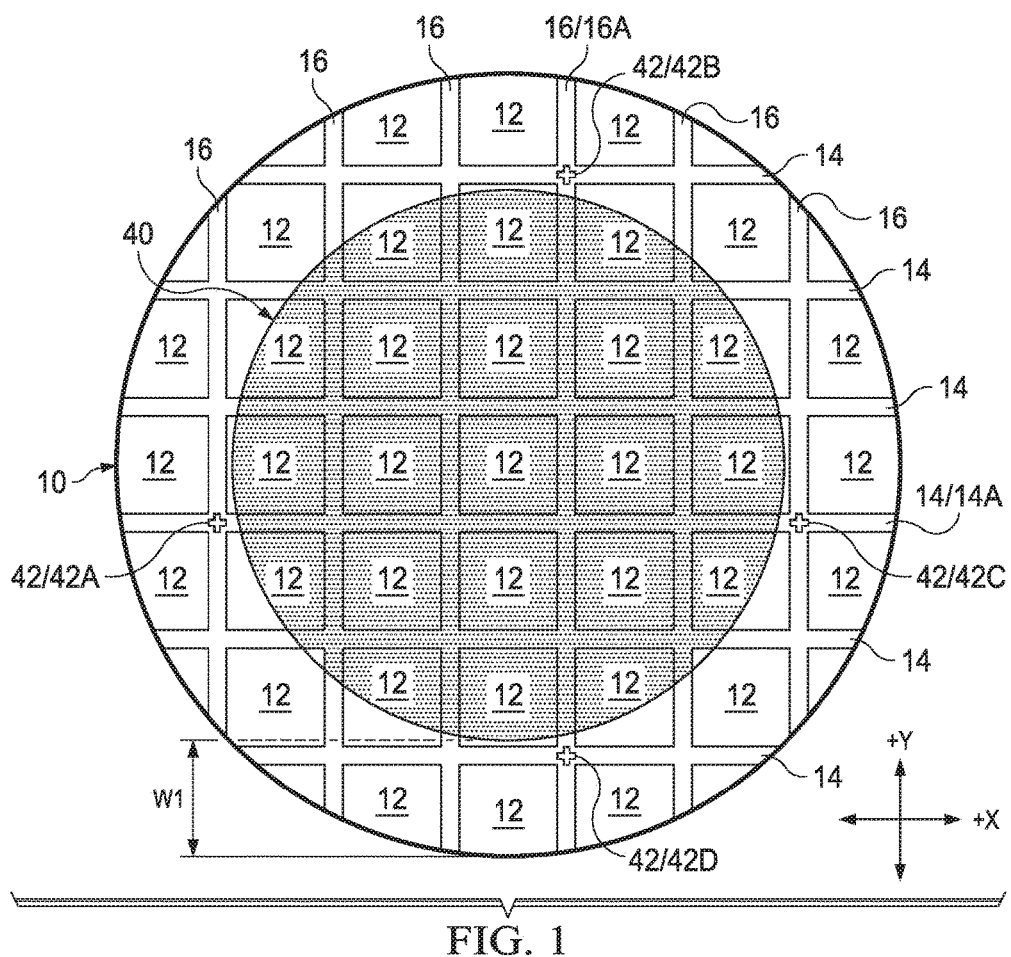
FIG. 1 illustrates a top view of a wafer in accordance with some embodiments.

FIG. 1 illustrates a schematic top view of wafer 10 in accordance with some exemplary embodiments. Wafer 10 includes chips 12 and the adjoining scribe lines 14 and 16, wherein scribe lines 14 and 16 separate chips 12 from each other. Scribe lines 14 have longitudinal directions parallel to the X direction, and scribe lines 16 have longitudinal directions parallel to the Y direction, which is perpendicular to the X direction. In each of chips 12, there may be a seal ring (not shown) formed, wherein the outer boundaries of the seal rings define the outer boundaries of chips 12. Each of the scribe lines 14 is between and adjoining two rows of chips 12, and each of the scribe lines 16 is between and adjoining two columns of chips 12. It is noted that wafer 10 is not drawn in scale, and the sizes of chips 12, scribe lines 14 and 16, molding compound 40, etc. are rescaled for clarity.

Figure 2:
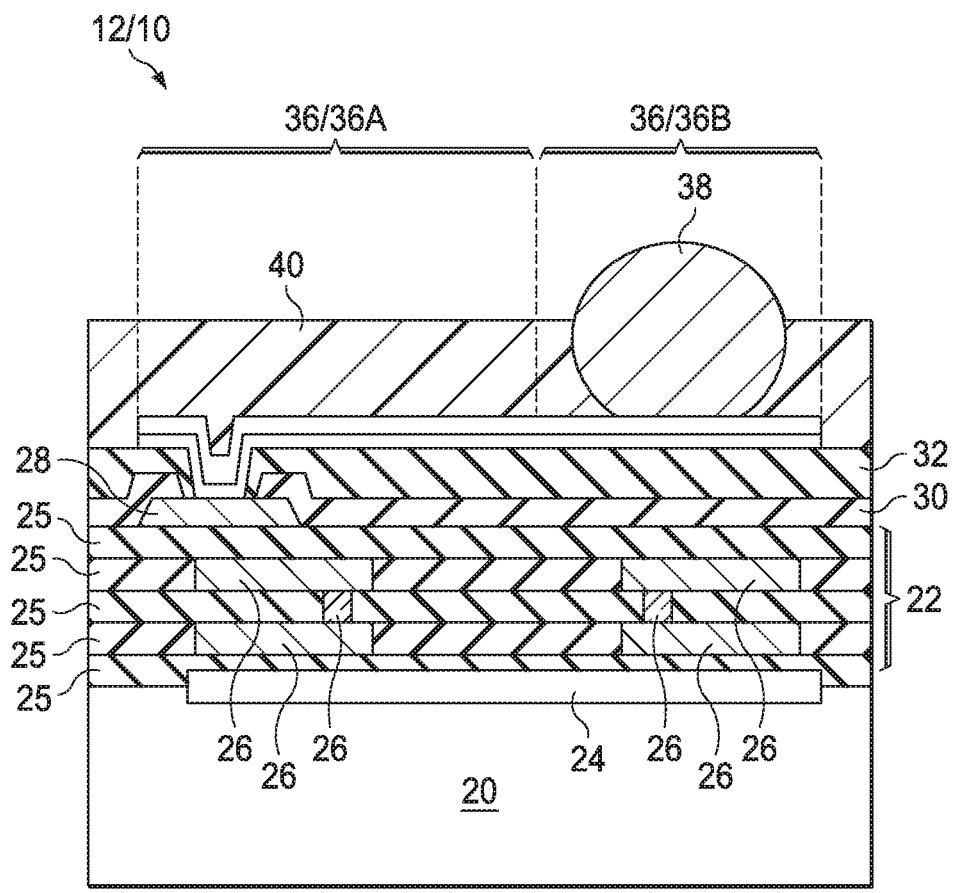
FIG. 2 illustrates a cross-sectional view of a wafer in accordance with some embodiments.

FIG. 2 illustrates a cross-sectional view of a portion of chip 12. In some embodiments, chip 12 includes substrate 20, which may be a semiconductor substrate, such as a silicon substrate. In alternative embodiments, substrate 20 is formed of other semiconductor materials including, and not limited to, silicon germanium, silicon carbon, gallium arsenide, a III-V compound semiconductor, or the like. In some embodiments, wafer 10 is a device wafer, and semiconductor devices 24, which may include transistors, are formed at the front surface of substrate 20. Interconnect structure 22, which includes metal lines and vias 26 formed therein, is formed over substrate 20. Metal lines and vias 26 are electrically coupled to semiconductor devices 24. The metal lines and vias may be formed of copper or copper alloys, and may be formed using damascene processes. Interconnect structure 22 may include a plurality of dielectric layers 25, which may include an Inter-Layer Dielectric (ILD) and Inter-Metal Dielectrics (IMDs, not shown), with metal lines and vias 26 disposed in dielectric layers 25. In alternative embodiments, wafer 10 is an interposer wafer, and is substantially free from integrated circuit devices (such as transistors, resistors, capacitors, inductors, and/or the like) therein.

Metal pad 28 is formed over interconnect structure 22. Metal pad 28 may comprise aluminum (Al), copper (Cu), silver (Ag), gold (Au), nickel (Ni), tungsten (W), alloys thereof, and/or multi-layers thereof. Metal pad 28 may be electrically coupled to semiconductor devices 24, for example, through metal lines and vias 26. Passivation layer 30 may be formed to cover the edge portions of metal pad 28. In some exemplary embodiments, passivation layer 30 comprises a silicon oxide layer and a silicon nitride layer over the silicon oxide layer, although other dielectric materials such as Un-doped Silicate Glass (USG) may be used. An opening is formed in passivation layer 30, and hence the central portion of metal pad 28 is exposed through the opening.

Polymer layer 32 is formed over passivation layer 30, wherein polymer layer 32 extends into the opening in passivation layer 30. Polymer layer 32 may include a photo sensitive material in accordance with some embodiments. For example, the material of polymer layer 32 includes, and is not limited to, polyimide, polybenzoxazole (PBO), and the like.

Polymer layer 32 also includes an opening, through which the top surface of metal pad 28 is formed. Post-Passivation Interconnect (PPI) 36, which is a conductive feature, extends into the opening in polymer layer 32. PPI 36 includes a via portion in the opening in polymer layer 32 and in physical contact with the top surface of metal pad 28. In some embodiments, PPI 36 includes a seed layer (a lower portion of PPI 36), which is formed over, and may be in contact with, polymer layer 32. In some embodiments, the seed layer is a composite layer comprising a plurality of layers. For example, the seed layer may include a bottom layer and an upper layer (not shown), wherein the bottom layer includes a titanium layer, a titanium nitride layer, a tantalum layer, a tantalum nitride layer, or the like. In alternative embodiments, the seed layer may be a single layer, which may be a copper layer, for example. The materials of the upper layer may include copper or copper alloys. In some embodiments, PPI 36 includes PPI line 36A and PPI pad 36B, wherein PPI pad 36B is wider (when viewed from the top view of chip 12) than the respective connecting PPI line 36A.

Electrical connector 38 is formed over, and is electrically coupled to, PPI pad 36B. In some embodiments, electrical connector 38 is a solder ball (and hence is referred to solder ball 38 hereinafter). Solder ball 38 may be formed of a Sn—Ag alloy, a Sn—Ag—Cu alloy, or the like, and may be lead-free or lead-containing. Solder ball 38 is reflowed, with its top surface being rounded. In alternative embodiments, electrical connector 38 has a structure different from solder ball. For example, electrical connector 38 may include a copper pillar (not shown) and a solder cap (not shown) on top of the copper pillar, wherein the copper pillar is formed through plating, and hence have vertical sidewalls.

Molding compound 40 is applied on wafer 10, wherein the lower portion of solder ball 38 is molded in molding compound 40, while the upper portion of solder ball 38 is over the top surface of molding compound 40. Molding compound 40 is sometimes referred to as a liquid molding compound since it is in the form of a liquid when dispensed, although it is a solid after being cured. After the solidification of molding compound 40, the top end of solder ball 38 protrudes out of the top surface of the major portions of molding compound 40.

As shown in FIG. 1, molding compound 40 may cover a majority of wafer 10 including the center portion, and leaves an edge portion of wafer 10 not covered. The uncovered edge portion may form an edge ring. The relative size of the edge ring (with relative to the size of wafer 10) is exaggerated in order to show alignment marks 42. Width W1 of the edge ring may be between 3 mm and about 6 mm, for example. It is appreciated, however, that the values recited throughout the description are merely examples, and may be changed to different values. Solder balls 38 (FIGS. 2 and 3) are formed at the front surface of wafer 10, and protrude through the surface of molding compound 40. For clarity, solder balls 38 are not shown in FIG. 1.

Referring to FIG. 3, a cross-sectional view of wafer 10 is schematically illustrated. For clarity, the details of wafer 10 are not shown, and may be found referring to FIG. 2. FIG. 3 illustrates that wafer 10 include solder balls 38, wherein the lower parts of solder balls 38 are embedded in molding compound 40. Molding compound 40 extends close to edge 10A of wafer 10, wherein edge ring 10B of wafer 10 is not covered with molding compound 40.

Next, as shown in FIG. 4, openings 42 are formed to extend from top surface 10C of wafer 10 into wafer 10. Throughout the description, openings 42 are also referred to as alignment marks since they act as the alignment marks in the subsequent die-sawing process. In some embodiments, openings 42 penetrate through layers 32, 30, and 25 (also refer to FIG. 2). Openings 42 also extend into substrate 20, which may be a semiconductor substrate such as a silicon substrate. Furthermore, openings 42 may extend into substrate 20 by depth D1, which may be greater than about 2 μm, or greater than about 25 μm. In some embodiments, the bottoms of openings 42 are at an intermediate level between front surface 20A and back surface 20B of substrate 20. In alternative embodiments, openings 42 are through-openings penetrating through substrate 20 and wafer 10. In FIG. 4, the through-openings 42 are shown with dashed lines.

Referring back to FIG. 1, a top view of alignment marks 42 is schematically illustrated. There are at least two alignment marks 42 (such as alignment marks 42A and 42B) formed in wafer 10, wherein each of the alignment marks 42 may include one opening or a plurality of openings forming the alignment marks collectively. In some embodiments, alignment marks 42 are formed in scribe lines 14 and/or 16. Furthermore, alignment marks 42 may be (although they don't have to be) formed at the cross-points of scribe lines 14 and 16. Each of the alignment marks 42 may be surrounded by four dies, which may be the dies that will be discarded since at least a part of these dies are in the Edge Bevel Removal (EBR) region of wafer 10. The respective dies are referred to as ugly dies throughout the description. In alternative embodiments, each of alignment marks 42 may also be formed in scribe lines 14 or 16 but not at the cross-points of scribe lines 14 and 16. In some embodiments, alignment marks 42A and 42B in combination are in at least one of scribe lines 14 and one of scribe lines 16. In yet alternative embodiments, alignment marks 42 are formed in the ugly dies, for example, at the corners of ugly dies.

In alternative embodiments, more alignment marks 42 may be added for easier determination of the positions of scribe lines. For example, FIG. 1 illustrates alignment marks 42C and 42D, wherein alignment marks 42A and 42C are on opposite sides of wafer 10, and alignment marks 42B and 42D are on the opposite sides of wafer 10. Alignment marks 42A and 42C may be, or may not be, in the same scribe line 14. Alignment marks 42B and 42D may be, or may not be, in the same scribe line 16. Alignment marks 42 may be formed in the edge ring of wafer 10, wherein the edge ring is where no molding compound 40 is formed. Accordingly, scribe lines 14 and 16 may be easily identified for the formation of alignment marks 42.

Figure 8:
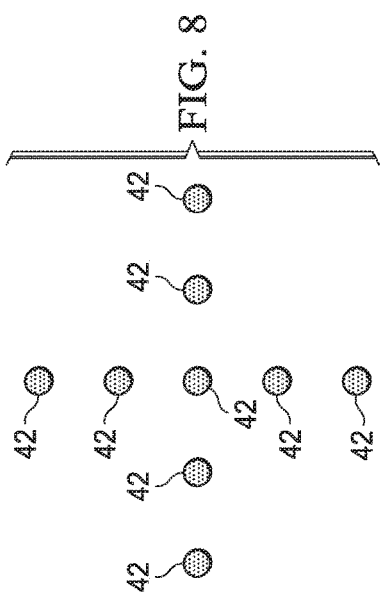
FIG. 8 illustrates an alignment mark in accordance with some alternative exemplary embodiments, wherein the alignment mark includes a plurality of discrete openings.

Alignment marks 42 may have any pattern, as long as they can be identified. In some exemplary embodiments, alignment marks 42 have a top view of a cross, which includes two strip openings crossing each other. An example of the cross-shaped alignment mark 42 is shown in FIG. 1. In other embodiments, as shown in FIG. 8, an alignment mark includes a plurality of discrete openings that are aligned to form a distinguishable layout such as a cross, a straight line, a triangle, a rectangle, or the like. Alignment marks 42 may be formed using a laser to cut into wafer 10. Alternatively, alignment marks 42 may be formed using a blade, a metal drill, or the like. Alignment marks 42 extend into wafer 10 in a direction perpendicular to the top surface of wafer 10, so that when alignment marks 42 are exposed from the back side of wafer 10, they are in the same location with relative to scribe lines 14 and 16 and chips 12.

Figure 5:
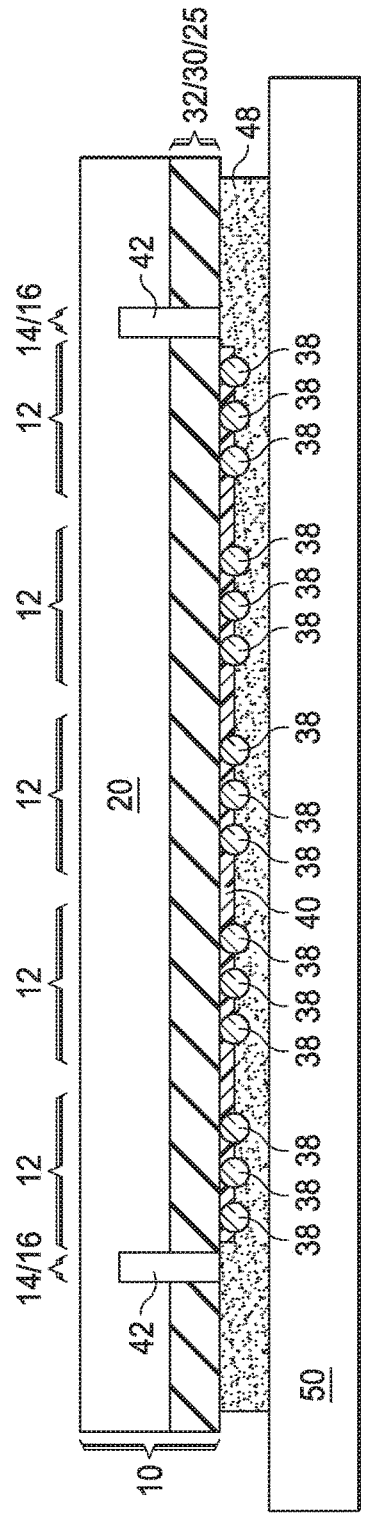
Figure 6:
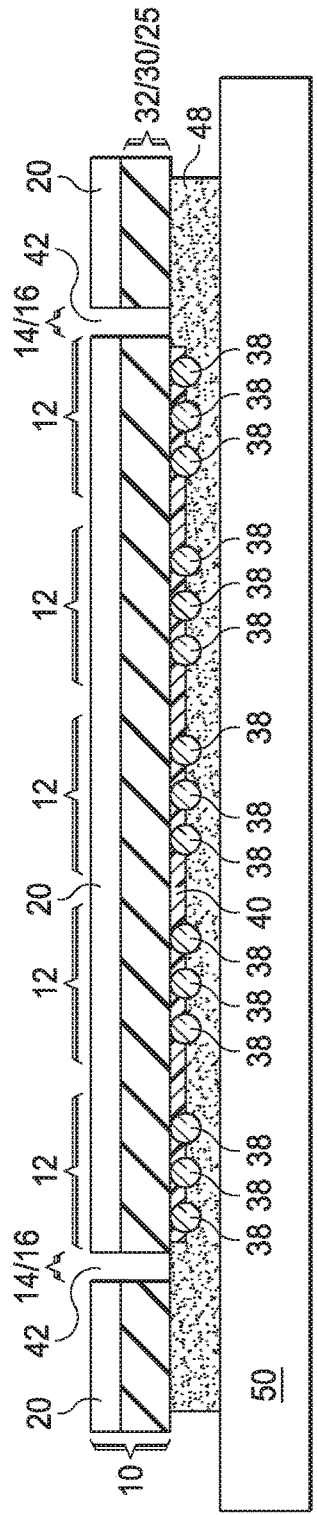

Referring to FIG. 5, wafer 10 is adhered to carrier 50, for example, through adhesive 48. In some embodiments, carrier 50 is a tape with pre-applied adhesive 48. Alternatively, carrier 50 is a rigid carrier, which may be a glass carrier, a silicon wafer, an organic carrier, or the like. The front surface of wafer 10 faces carrier 50. Next, as shown in FIG. 6, a backside grinding is performed on the backside of wafer 10 to thin wafer 10. In the embodiments wherein wafer 10 comprises substrate 20, substrate 20 is grinded from its back surface. After the back side grinding, alignment marks 42 are revealed through the back surface of wafer 10.

Figure 7:
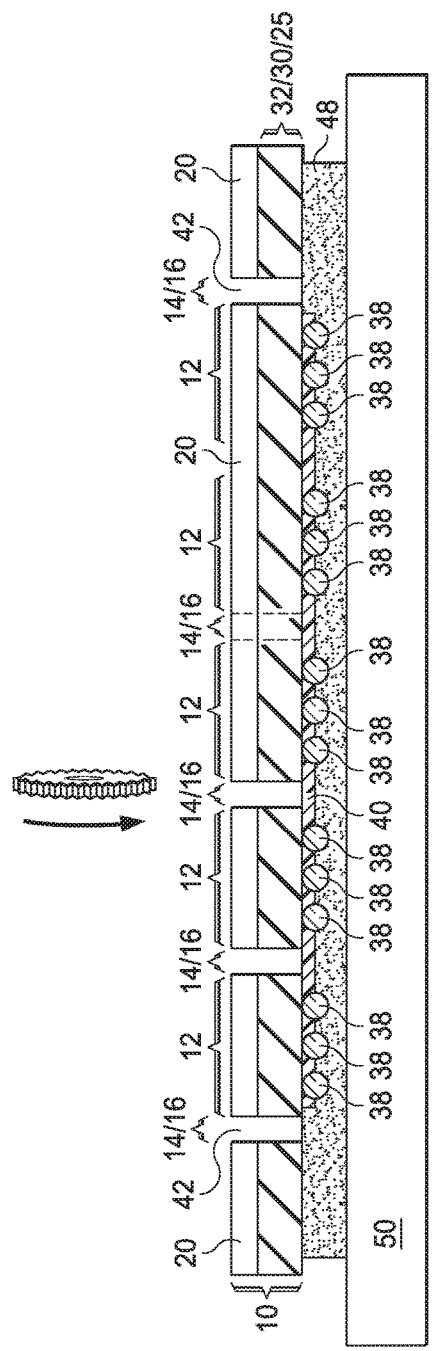

FIG. 7 illustrates the die-sawing of wafer 10. Since alignment marks 42 are perpendicular to the top surface of wafer 10, the positions of alignment marks 42 found on the back surface of wafer 10 are the same as the positions of alignment marks 42 on the front surface of wafer 10. With alignment marks 42 being visible on the back surface of wafer 10, alignment marks 42 may be used to determine the position of scribe lines 14 and 16. For example, the positions of scribe lines 14A and 16A (FIG. 1) may be determined from alignment marks 42A and 42B, respectively. The positions of other scribe lines 14 and 16 may be determined by shifting from scribe lines 14A and 16A, respectively, by distances equal to the integer times of the pitch of chips 12. Accordingly, with at least two alignment marks 42 formed, the positions of all scribe lines 14 and 16 may be found.

Referring again to FIG. 7, a die-sawing step is performed to cut through scribe lines 14 and 16, whose positions have been determined from alignment marks 42 that are exposed on the back surface of wafer 10. Accordingly, chips 12 are separate into discrete dies.

In accordance with the embodiments of the present disclosure, by performing die-sawing from the back sides of wafers, the cost for manufacturing chips 12 may be lowered. For example, if wafer 10 is to be sawed from the front side of wafer 10, after the backside grinding as shown in FIG. 6, wafer 10 needs to be demounted from carrier 50, so that the back surface of wafer 10 can be adhered to a dicing tape. Wafer 10 may then be sawed from its front side. In the embodiments of the present disclosure, however, after the backside grinding, wafer 10 may be sawed directly. Therefore, less manufacturing steps are needed, and the manufacturing cost is reduced.

In accordance with some embodiments, a method includes forming an opening extending from a front surface of a wafer into the wafer, and sawing the wafer from the back side of the wafer. The opening exposed through the back surface of the wafer is used as an alignment mark for the sawing.

In accordance with other embodiments, a method includes forming a molding compound molding a lower portion of an electrical connector of a wafer therein. The molding compound is at a front surface of the wafer. The molding compound covers a center region of the wafer, and leaves an edge ring of the wafer not covered. An opening is formed to extend from the front surface of the wafer into the wafer, wherein the opening is in the edge ring of the wafer. A backside grinding is performed on the wafer until the opening is revealed through a back surface of the wafer.

In accordance with yet other embodiments, a method includes forming a first opening and a second opening extending from a front surface of a wafer to an intermediate level of a semiconductor substrate of the wafer. The first opening and the second opening are in scribe lines of the wafer. The method further includes adhering the front surface of the wafer to a carrier, performing a backside grinding on a back side of the semiconductor substrate, wherein the first and the second openings are revealed through the substrate, determining scribe lines of the wafer using the first and the second openings as alignment marks, and sawing the wafer by sawing through the scribe lines.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
    from a front surface of a wafer, removing a portion of the wafer to form an opening extending into the wafer, wherein the opening is located in an overlap region of a first scribe line and a second scribe line; and
    sawing the wafer from a back side of the wafer, wherein during the sawing the wafer, a semiconductor material of a semiconductor substrate in the wafer is sawed through, and wherein the opening is exposed through a back surface of the wafer before the wafer is sawed, and the opening is used as an alignment mark for the sawing.

2. The method of claim 1, wherein when the opening is used as the alignment mark, the opening is unfilled, and penetrates from a front surface to a back surface of the wafer.

3. The method of claim 1, wherein an entirety of the opening is in an Edge Bevel Removal (EBR) region of the wafer.

4. The method of claim 1, wherein an entirety of the opening is in the overlap region of the first scribe line and the second scribe line.

5. The method of claim 1, wherein the wafer comprises:
    solder regions at the front surface of the wafer; and
    a molding compound molding a lower portion of each of the solder regions, wherein the molding compound covers a center region of the wafer, and leaves an edge ring of the wafer not covered, and wherein an entirety of the opening is formed in the edge ring.

6. The method of claim 1 further comprising performing a backside grinding on the wafer to expose the opening from a back side of the wafer, wherein the sawing the wafer is performed on the ground wafer.

7. The method of claim 1, wherein when sawing the wafer, the alignment mark is visible from the back surface of the wafer.

8. A method comprising:
    forming an opening extending from a front surface of a wafer into the wafer, wherein the opening is surrounded by four dies;
    removing portions of the wafer from backside, with the opening exposed to the backside after the portions of the wafer are removed;
    determining a position of a first scribe line of the wafer from a backside of the wafer using the opening as an alignment mark; and
    sawing through the first scribe line from the backside of the wafer.

9. The method of claim 8, wherein when the wafer is sawed, the opening is empty inside.

10. The method of claim 8 further comprising sawing the wafer into individual dies, wherein during the sawing, a semiconductor material of a semiconductor substrate in the wafer is sawed through.

11. The method of claim 8, wherein the opening is fully inside an overlap region of the first scribe line and a second scribe line.

12. The method of claim 8, wherein before the portions of the wafer are removed from backside, the opening extends from the front surface of the wafer to the backside.

13. The method of claim 8, wherein when the portions of the wafer are removed from backside, the front surface of the wafer is adhered to a carrier, and when the wafer is sawed, the wafer is adhered to the carrier.

14. The method of claim 8, wherein the opening is formed using laser or a drill.

15. The method of claim 8 further comprising, after the wafer is sawed, discarding the four dies.

16. A method comprising:
forming an opening in a die of a wafer, wherein the opening extends from a front surface of the wafer to an intermediate level of a semiconductor substrate of the wafer;
adhering the front surface of the wafer to a carrier;
performing a backside grinding on a backside of the semiconductor substrate, wherein the opening is visible from the backside of the semiconductor substrate;
determining a scribe line of the wafer using the opening as alignment marks; and
sawing the wafer through the scribe line.

17. The method of claim 16, wherein the opening is in an edge ring of the wafer.

18. The method of claim 16, wherein the sawing the wafer is performed when the front surface of the wafer is adhered to the carrier.

19. The method of claim 16, wherein the opening is formed through laser drilling.

20. The method of claim 16, wherein the die is in an Edge Bevel Removal (EBR) region of the wafer, and after the wafer is sawed, the die is discarded.

* * * * *